United States Patent
Polnyl

(10) Patent No.: US 7,607,932 B1
(45) Date of Patent: Oct. 27, 2009

(54) SOCKET HAVING TWO CAMS

(75) Inventor: Igor Polnyl, Aurora, IL (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/287,923

(22) Filed: Oct. 14, 2008

(51) Int. Cl.
*H01R 13/625* (2006.01)

(52) U.S. Cl. .................................................. 439/342

(58) Field of Classification Search .............. 439/342
See application file for complete search history.

(56) References Cited

U.S. PATENT DOCUMENTS

| | | | |
|---|---|---|---|
| 5,658,160 A | 8/1997 | Lai | |
| 6,059,596 A * | 5/2000 | Pei et al. | 439/342 |
| 6,086,402 A * | 7/2000 | Huang | 439/342 |
| 6,152,756 A * | 11/2000 | Huang et al. | 439/342 |
| 6,155,861 A * | 12/2000 | Lin | 439/342 |
| 6,159,032 A * | 12/2000 | McHugh et al. | 439/342 |
| 6,165,000 A * | 12/2000 | Huang | 439/342 |
| 6,171,128 B1 * | 1/2001 | Huang et al. | 439/342 |
| 6,217,361 B1 | 4/2001 | Whitaker | |
| 6,347,951 B1 * | 2/2002 | Murr | 439/342 |
| 6,450,824 B1 * | 9/2002 | Lemke et al. | 439/342 |
| 6,500,019 B1 | 12/2002 | HonHai | |
| 6,722,910 B2 * | 4/2004 | Kajinuma | 439/342 |
| 2004/0087199 A1 * | 5/2004 | Tran et al. | 439/342 |
| 2005/0064754 A1 * | 3/2005 | Tan | 439/342 |
| 2006/0141841 A1 * | 6/2006 | Liao et al. | 439/342 |
| 2006/0205259 A1 * | 9/2006 | Hashimoto | 439/342 |
| 2007/0020984 A1 * | 1/2007 | Boudreaux | 439/342 |
| 2008/0108239 A1 * | 5/2008 | Ma | 439/259 |
| 2008/0214037 A1 * | 9/2008 | Liao | 439/342 |
| 2008/0280473 A1 * | 11/2008 | Zhou et al. | 439/259 |
| 2008/0311777 A1 * | 12/2008 | Liao | 439/342 |
| 2009/0068876 A1 * | 3/2009 | Ma | 439/342 |

* cited by examiner

*Primary Examiner*—Ross N Gushi
(74) *Attorney, Agent, or Firm*—Andrew C. Cheng; Wei Te Chung; Ming Chieh Chang

(57) ABSTRACT

A socket adapted for electrically connecting an IC package, comprises a base defining a receiving space for the IC package, a plurality of contacts received in the base, a pair of metal cams mounted on two opposed sides of the base and a pair of metal plates for retaining the cams on the base. Each cam defines a first position and a second position where the cam is close to a center of the receiving space relative to the first position. When the cam rotates from its first position and its second position, the cam can force the IC package received in the receiving space to move.

20 Claims, 8 Drawing Sheets

US 7,607,932 B1

SOCKET HAVING TWO CAMS

BACKGROUND OF THE INVENTION

1. Field of the Invention

The present invention relates to a socket, especially to a Pin Grid Array (PGA) socket mounted to a printed circuit board and adapted for electrically connecting a semiconductor package.

2. Description of the Related Art

With the development of technology, socket connectors, which have pins or solder balls, are found widespread applications in computers and other electrical devices for transmitting signals and conducting current between a printed circuit board (PCB) and an IC package.

U.S. Pat. No. 6,500,019, issued to Honhai on Dec. 31, 2002 discloses a related socket, the socket comprises an insulative base, a dielectric cover, a metallic cam, a washer, a plurality of electrical contacts, and a metallic ring. The base comprises a plurality of passageways for contacts and a flange located at one side of the base and defining a hole. The cover comprises a plurality of passageways extending therethrough for insertion of pins of an IC package and a mounting portion corresponding to the flange of the base and defining a circular aperture. The metallic ring is secured in the aperture of the cover, the cam inserts into the metallic ring and extends beyond a bottom surface of the base, so that the cam is rotatably secured to the base and the cover by being riveted with the washer. The metallic cam comprises a head, an upper disk extending downwardly from the head, a lower disk and a riveting portion. A rotational axis of the lower disk is offset from a rotational axis of the upper disk. So, a rotation of the cam forces the cover to slide along the base and makes the pins (not shown) of the PGA chip engage/disengage with the contacts in the passageways.

However, the socket has a complex configure, that need more time to manufacture and assembly the socket, and that also means the product has a high cost.

Hence, an improved socket is required to overcome the disadvantages of the prior art.

SUMMARY OF THE INVENTION

An object of the invention is to provide a socket with simple configure.

To achieve the above-mentioned object, a socket, adapted for electrically connecting an IC package, comprises an insulative housing having a main body which defining a receiving space for the IC package and two flanges on two sides of the main body; and a pair of cams located on the flanges respectively, each cam defining a first position and a second position where the cam is close to a center of the receiving space relative to the first position, each cam can rotate between its first position and its second position.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
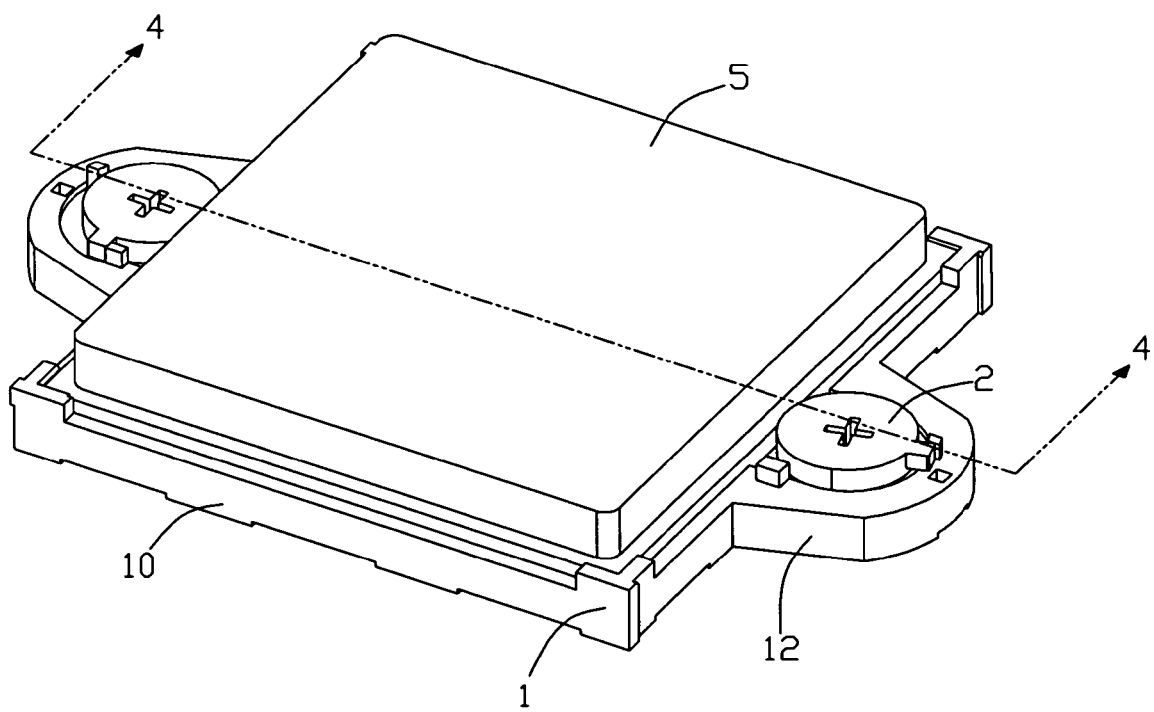
FIG. 1 is an assembled, perspective view of a socket in accordance with a preferred embodiment of present invention.
Figure 2:
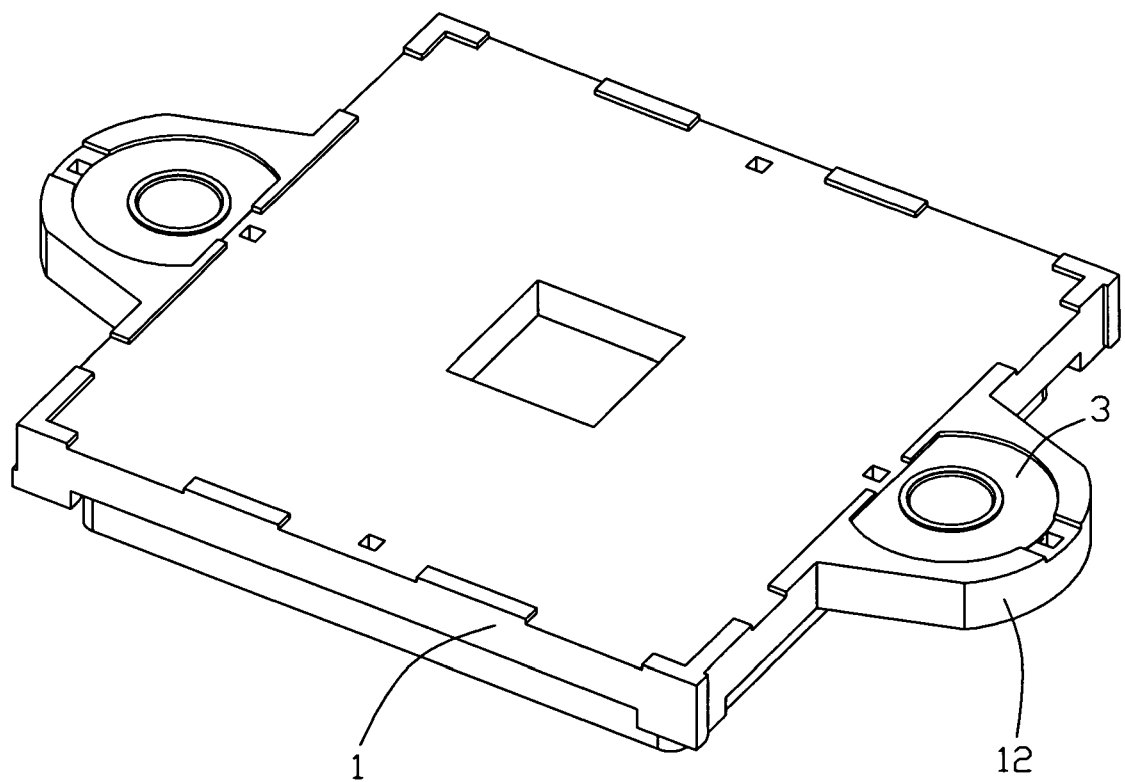
FIG. 2 is another assembled, perspective view of the socket shown in FIG. 1, taken from another side.

Referring to FIGS. 1-2, a socket in accordance with a preferred embodiment of present invention is adapted for electrically connecting an IC package 5 to a printed circuit board (not shown), the socket comprises an insulative base 1, a pair of metal cams 2 assembled to the base 1, a pair of metal plates 3 for retaining the cams 2 on the base 1 and a plurality of contacts (not shown).

Figure 3:
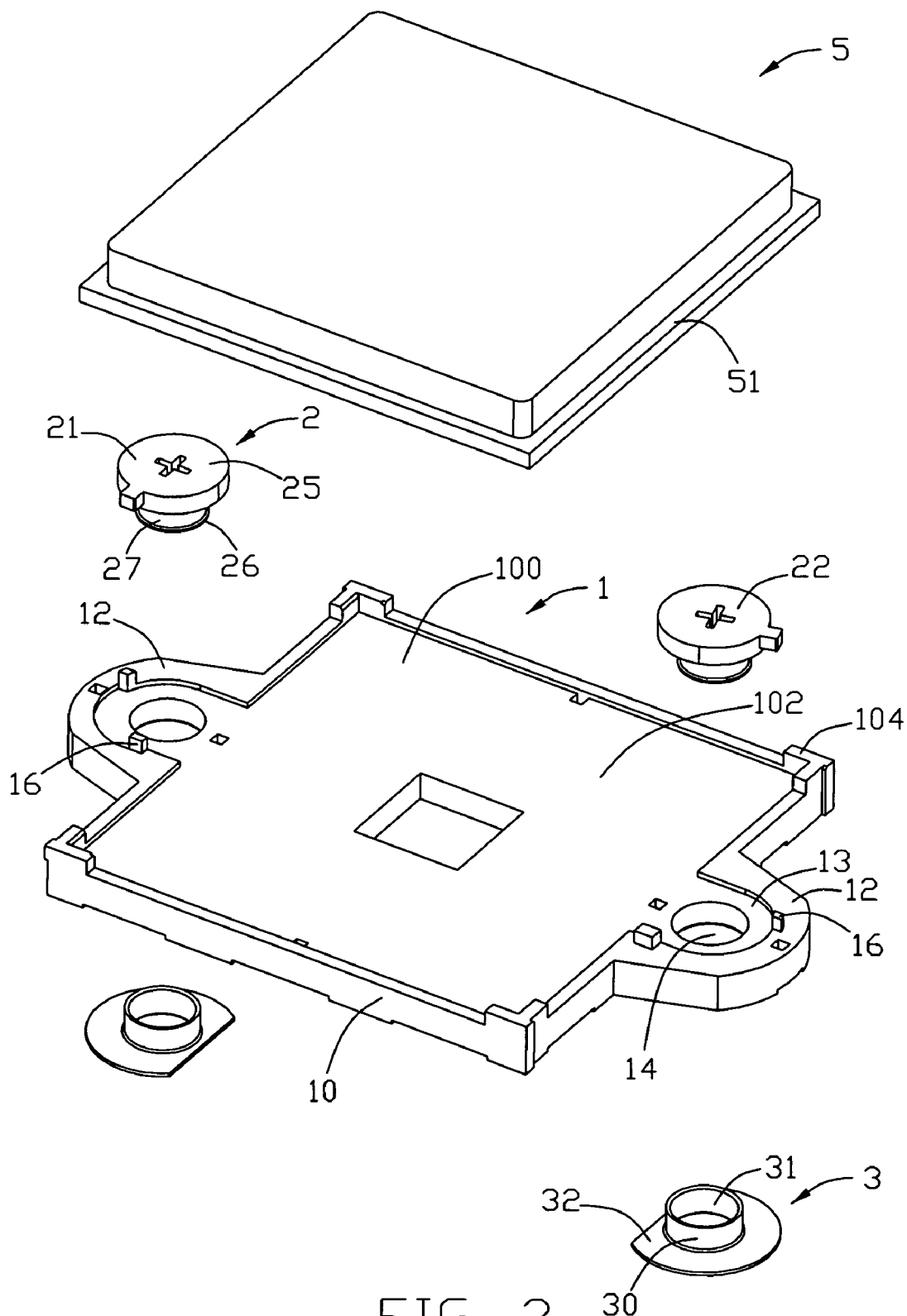
FIG. 3 is an exploded, perspective view of the socket shown in FIG. 1.
Figure 4:
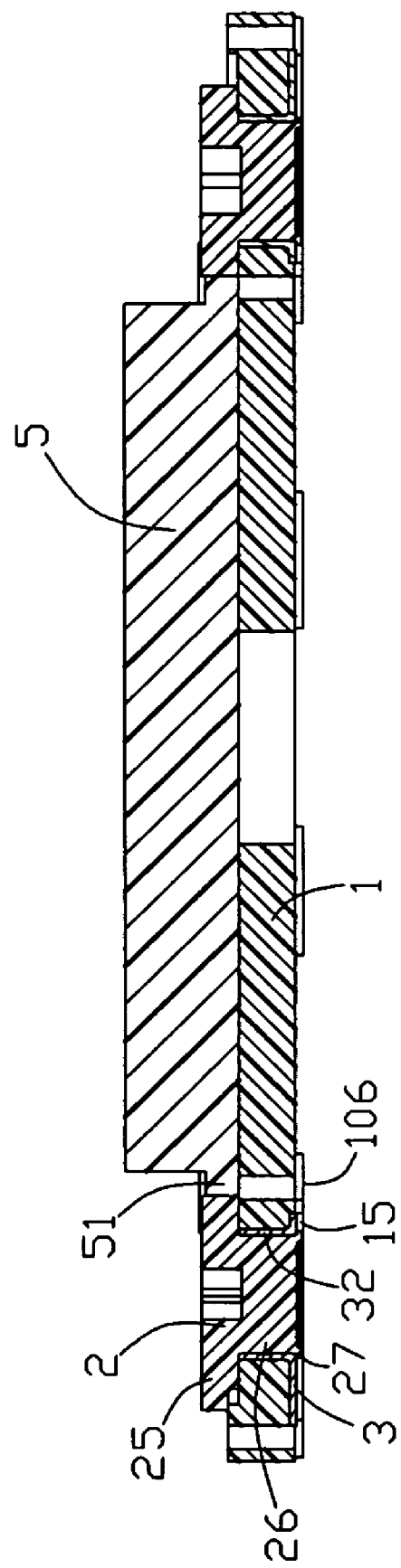
FIG. 4 is a section view of the socket along line 4-4 in FIG. 1.

Referring to FIG. 3, conjoining with FIG. 4, the base 1 comprises a main body 10 in the shape of a square, and two flanges 12 symmetrically disposed on two opposed sides of the main body 10. The main body 10 has a bottom wall 102 and a plurality of sidewalls 104, which define a receiving space 100 for the IC package 5, together with the bottom wall 102. The bottom wall 102 defines a plurality of passageways 103 extending vertically there through.

The two flanges 12 have a same configure. Each of the two flange 12 is in an approximately arc shape and defines a recess 13 downwardly recessed from a center thereof and a circle hole 14 vertically passing through the recess 13. The recess 13 has a bottom face which is coplanar with a top surface of the main body 10, and communicates with the receiving space 100. Each of the two flanges 12 further has a room 15 on a bottom surface 106 thereof to receive the metal plate 3.

The two cams 2 include a first cam 21 and a second cam 22, which have a same configure. Each of the first and the second cams 21, 22 has an upper cylindrical post 25, a lower cylindrical post 26 downwardly extending from the upper cylindrical post 25, and a riveting end 27 on a bottom end of the lower cylindrical post 26.

Each of the metal plates 3 has a tube portion 30 with an aperture 31 and a horizontal piece 32 outwardly extending from a circumference edge of the tube portion 31 and having a contour corresponding to a shape of the room 15 of the base 1. The IC package 5 has a substrate plate 51 which can be directly forced by the cam 2.

Conjoined with FIG. 1, the metal plate 3 is mounted to the flange 12 of the base 1 from a bottom side, the horizontal piece 32 is received in the room 15, and the tube portion 30 is received in and inserts into the circle hole 14 of the base 1. The cam 2 is assembled to the flange 12 of the base 1 from a top side, the upper cylindrical post 25 is positioned in the recess 13 of the flange 12 and the lower cylindrical post 26 is received in the apertures 31 of the metal plate 3, respectively. The riveting end 27 extends beyond the bottom surface 106 of the base 1 and is riveted with the metal plate 3 to retain the cam 2 on the base 1.

Figure 5:
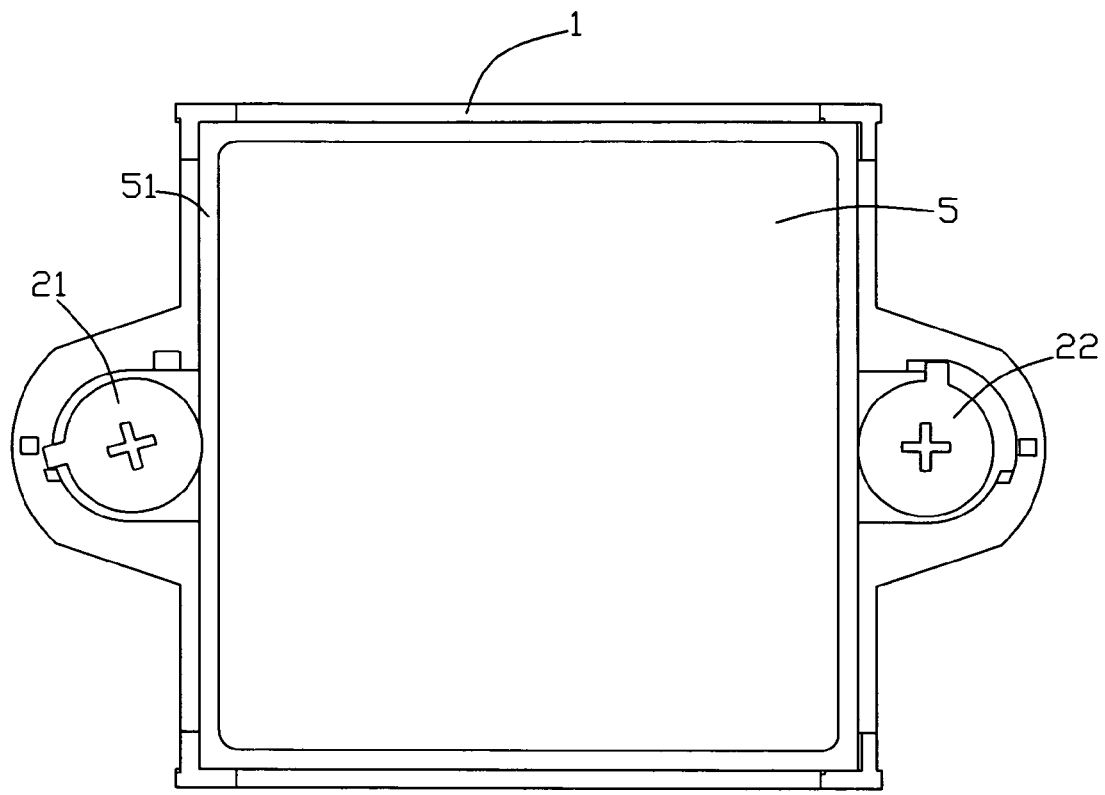
FIG. 5 is top view of the socket.
Figure 6:
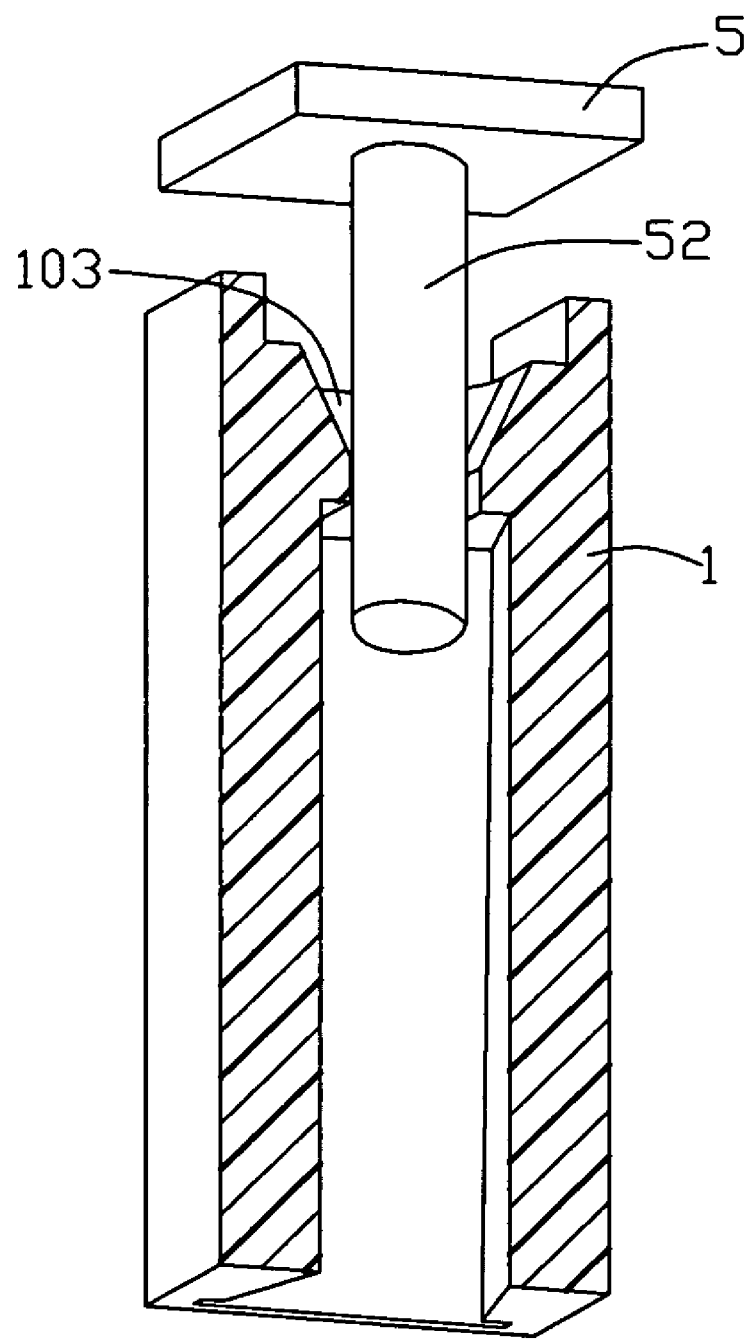
FIG. 6 is a sketch view, showing a pin of an IC package inserting into the socket.

Referring to FIG. 5 and FIG. 6, FIG. 5 shows a working process of the socket, the IC package 5 is received in the receiving space 100 of the socket and reliably retained by the cams 2. The IC package 5 has a plurality of pins 52 (only one is shown in FIG. 6) inserting into the passageway 103 of the socket to electrically connect with contact (now shown).

Figure 7:
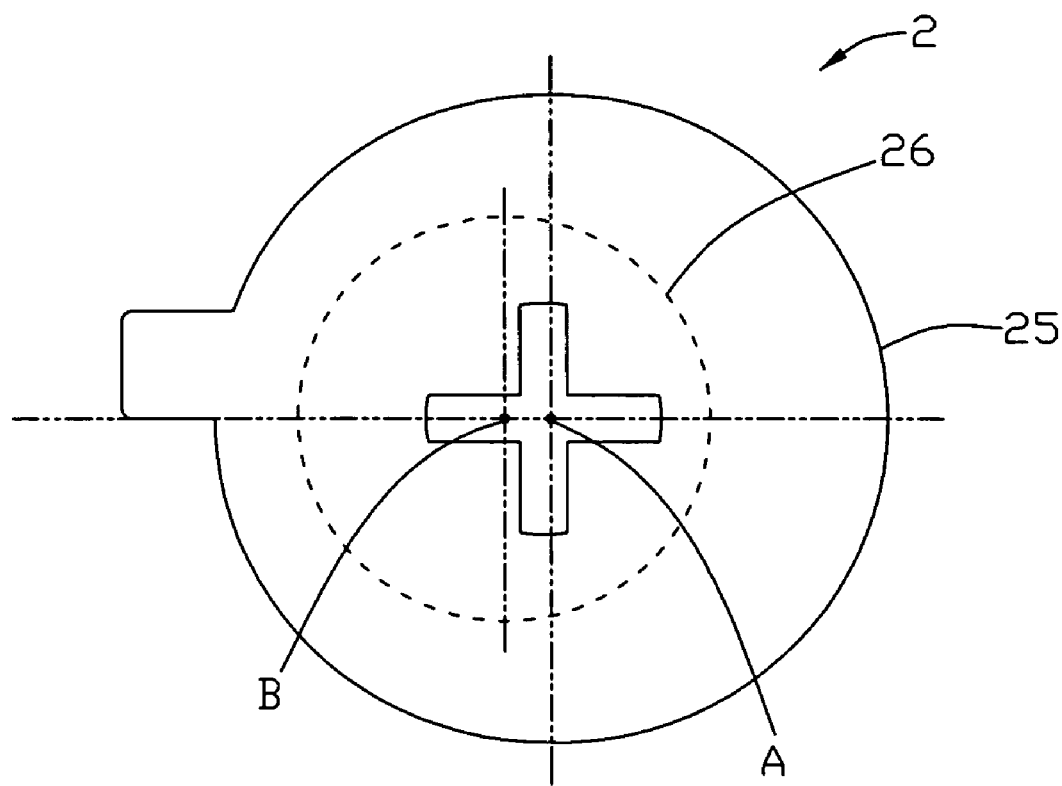
FIG. 7 is a front view of a cam of the socket.
Figure 8:
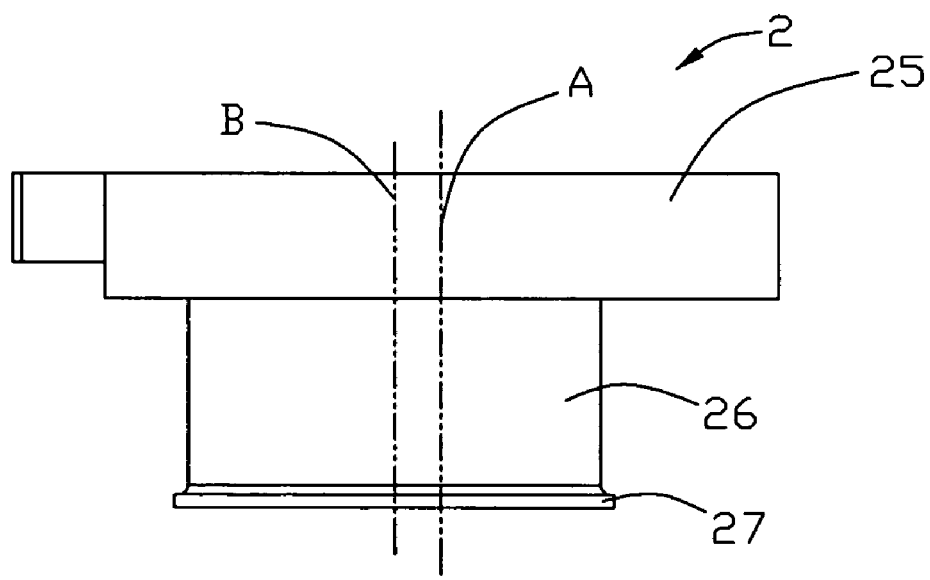
FIG. 8 is a side view of the cam of the socket.

Referring to FIG. 7 and FIG. 8, a center axis A of the upper cylindrical post 25 is offset from a center axis B of the lower cylindrical post 25, while the center line B is a rotational axis, so the upper cylindrical 25 can occur a deflection rotation and enter the receiving space 100 to forces the IC package 5 to move. The upper cylindrical post 25 defines a cross groove (not labeled), so that a driver (not shown) can drive the cam 2 to rotate, furthermore the upper cylindrical post 25 has a stop block (not labeled) protruding from an out edge thereof, correspondingly, the flange 12 is formed with two spaced projections 16 around the recess 13 to prevent the stop block (not labeled) from over rotation and define a move range of the cam 2.

Each of the cam 2 has a first position and a second position where the cam 2 is more close to a center of the space 100 relative to the first position, each cam 2 can rotate from its first position to its second position by being driven by the driver (not shown), the stop block (not labeled) engages with the projections 16 to limit a rotation the cam 2 only between its first position to its second position.

Referring to FIGS. 9A-9D, conjoined with FIG. 5 which showing the working process of the socket, firstly, the first cam 21 and the second cam 22 are both in the first positions (referring to FIG. 9A), in this state, the socket is open, the IC package 5 can be easily put in the space 100, then the first cam 21 is driven to rotate from its first position to its second position and forces the IC package 5 to move toward and abut against the opposed sidewall 104 (referring to FIG. 9B), of course, the IC package 5 may also abut against the second cam 22, anyway, the IC package 5 is retained by the cam 21 or by the cams 21, 22 and the sidewall 104 in a steady close state, that also is a working state of the socket, and the IC package 5 electrically connects with the contacts (not shown).

Figure 9A:
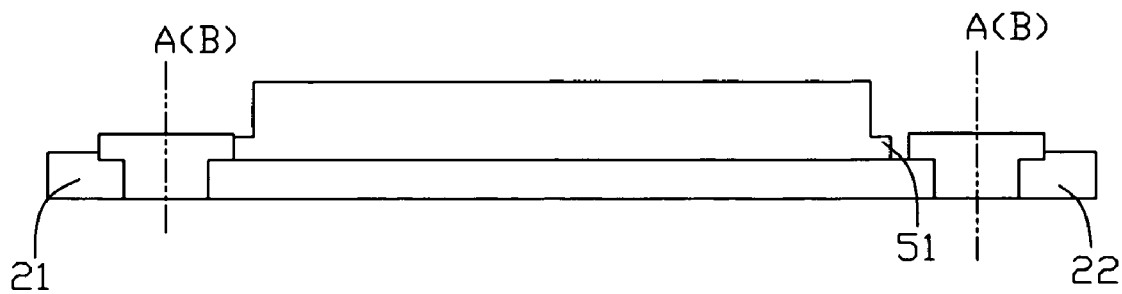
FIG. 9 is a sketch view to show an operating process of the socket.
Figure 9B:
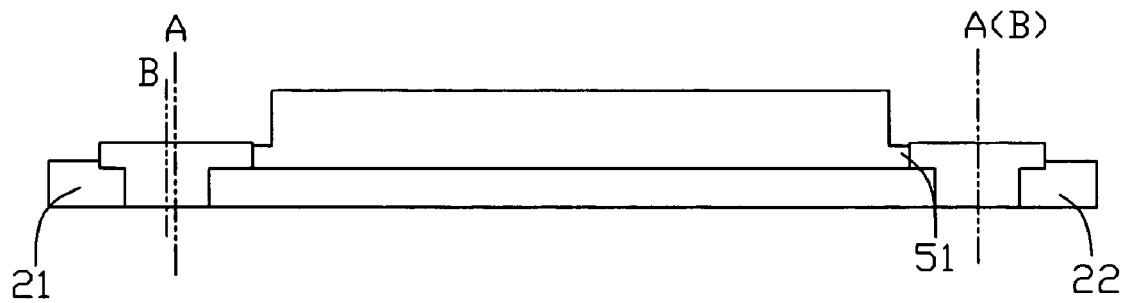
Figure 9C:
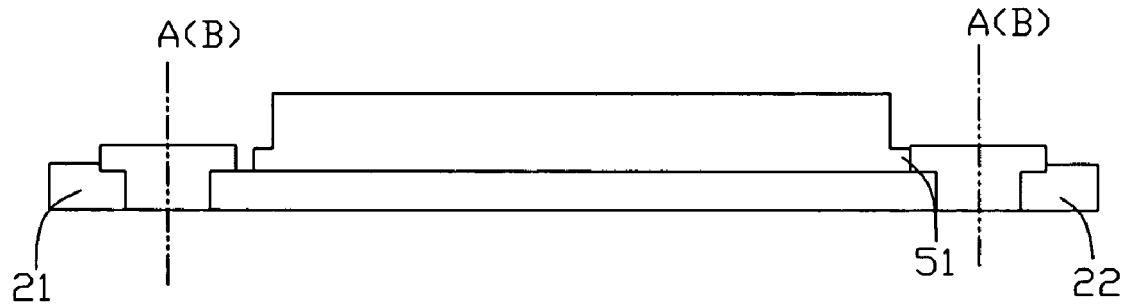
Figure 9D:
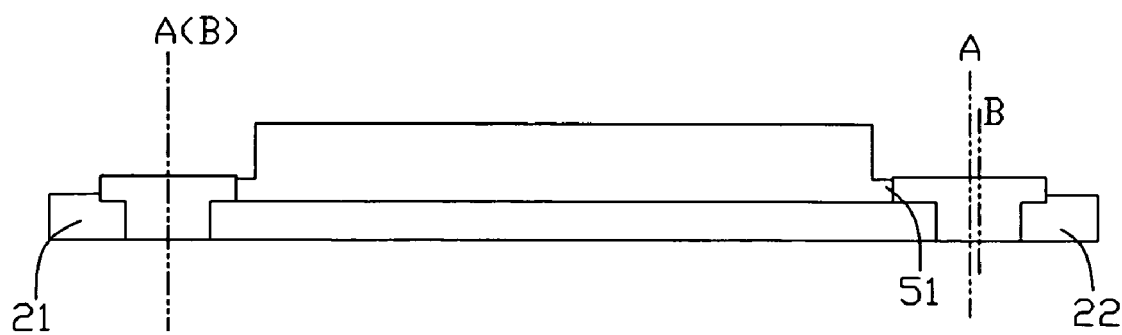

When removing the IC package 5 from the socket, firstly, the first cam 21 back rotates to its first position (referring to FIG. 9C), then the second cam 22 is driven to rotate from its first position to its second position to force the IC package 5 to return to an initial position (referring to FIG. 9D), finally, the second cam 22 back rotates to its first position, which also is an original state of the socket shown in FIG. 9A, so the first and the second cams 21, 22 both return to the first positions, then the IC package 5 is easily picked up from the receiving space 100. Some indicates (not shown) may provided on a top surface of the flange 12 to lead operator to a correct operation.

The socket has a simple configure with a simple cam 2 and without a cover, the socket also can reliably retain the IC package 5 in the receiving space 100 of the socket with an easy operation. For the socket does not have a cover, correspondingly the pin 52 can be designed with a short length, obviously, that can reduce a cost of the IC package 5.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims. For example, the side wall 104 may be equipped with a stepped structure to abut downwardly against the corresponding corners of the IC package 5 for retention. The second cam 22 may be equipped with a resilient device to urge the second cam 22 back to the first position once the rotation force is removed therefrom. Understandably, the first cam 21 may be equipped with the resilient device to urge the first cam 21 to back to the first position, if the retention of the IC package 5 is sufficient by the aforementioned steppe structures of the side wall.

What is claimed is:

1. A socket adapted for electrically connecting an IC package, comprising:
    a base having a main body which defining a receiving space for the IC package and two flanges on two opposed sides of the main body; and
    two cams located on the flanges respectively, each cam defining a first position and a second position where the cam is close to a center of the receiving space relative to the first position, each cam being able rotate between its first position and its second position.

2. The socket as described in claim 1, wherein the cam protrudes into the receiving space when the cam rotates from its first position to its second positions.

3. The socket as described in claim 2, wherein each cam forces the IC package to move in the receiving space when the cam is driven to rotate from its first position to its second position.

4. The socket as described in claim 3, wherein the cams include a first cam and a second cam, both of the first and the second cams firstly are in the first positions, so that the IC package can be easily put in the receiving space.

5. The socket as described in claim 4, wherein the main body has a plurality of sidewalls around the receiving space, the first cam rotates from its first position to its second position to force the IC package to move toward and abut against the opposed sidewall, so that the IC package is retained in a steady close state.

6. The socket as described in claim 5, wherein when remove the package, the first cam rotates back, then the second rotates from its first position to its second position to force the IC package to return to an initial position, finally, the second cam back rotates to its first position thereof, so the first and the second cams both return to the first positions, and the IC package can be easily be picked up.

7. The socket as described in claim 1, wherein a plurality of contacts are received in the base for electrically connecting with the IC package.

8. The socket as described in claim 1, further comprising two metal plate, the metal plate has a tube portion with an aperture and a horizontal piece outwardly extending from a circumference edge of the tube portion, the metal plate are mounted to the flange from a bottom side, the tube portion is received in a hole on the flange.

9. The socket as described in claim 1, wherein the cam has an upper cylindrical post, a lower cylindrical post downwardly extending from the upper cylindrical post and a riveting end on a bottom end of the lower cylindrical post, a center axis of the upper cylindrical post is offset from a center axis of the lower cylindrical post.

10. The socket as described in claim 9, wherein the lower cam inserts into the tube portion of the metal plate, the riveting end is riveted with the metal plate to retain the cam on the base.

11. A socket assembly comprising:
    a socket comprising a base defining a receiving space, two cams assembled to the base and located on two opposed ends of the receiving space and a plurality of contacts received in the base, each cam being able to rotate and protrude into the receiving space; and
    an IC package directly loading on the receiving space of the socket and contacting with the contacts of the socket, the IC package being pushed by each of the cams to move in the receiving space.

12. The socket assembly as described in claim 11, wherein the IC package has a plurality pins which electrically connect with the contacts of the socket, and since the socket has no cover, the pin can be designed with a short length.

13. The socket assembly as described in claim 11, wherein the IC package has a substrate plate which is directly forced by the cam.

14. The socket assembly as described in claim 13, wherein the base has a main body and two flanges on two opposed sides of the main body, the two cams are located on the flanges respectively, each cam defines a first position and a second position where the cam is close to a center of the receiving space relative to the first position, each cam can rotate between its first position and its second position.

15. The socket assembly as described in claim 14, wherein the cam protrudes into the receiving space and forces the IC package to move in the receiving space when the cam rotates from its first position to its second positions.

16. An electrical socket assembly comprising:
- an insulative housing defining a receiving cavity and equipped with opposite first and second rotatable cam devices located in the housing at two opposite ends of the receiving cavity;
- a plurality of contacts disposed in the housing;
- an electronic package disposed in the receiving cavity and moveable between a first location where the electronic package is not engaged with the contacts for loading/unloading, and a second location where the electronic package is engaged with the contacts for electrical connection;
- the first cam device rotatably defining a first position allowing the electronic package to be at the first location, and a second position urging the electronic package to be at the second location; and
- the second cam device rotatably defining a first place allowing the electronic package to be at the second location, and a second place urging the electronic package to be at the first location.

17. The electrical socket assembly as claimed in claim 16, wherein the housing is immovable and the electronic package disposed in the receiving cavity, is moveable relative to the housing with no other devices located therebetween.

18. The electrical socket assembly as claimed in claim 17, wherein said no other devices refer to devices moveable relative to the housing.

19. The electrical socket assembly as claimed in claim 16, wherein a free standing plate for insulation without engagement with the housing and with a plurality of through holes therein, is located between the electronic package and the housing under a condition that pins of the electronic package extend through the corresponding through holes to engage the corresponding contacts, respectively.

20. The electrical socket assembly as claimed in claim 16, wherein said first cam device and said second cam device directly engage and push the electronic package for moving said electronic package.

\* \* \* \* \*